United States Patent [19]

Sleder

[11] Patent Number: 4,471,407
[45] Date of Patent: Sep. 11, 1984

[54] COMBINATION HEAT SINK FOR A SEMICONDUCTOR

[75] Inventor: Richard L. Sleder, Howards Grove, Wis.

[73] Assignee: Kohler Company, Kohler, Wis.

[21] Appl. No.: 423,803

[22] Filed: Sep. 27, 1982

[51] Int. Cl.$^3$ .............................. H05K 7/20
[52] U.S. Cl. .................... 361/387; 361/388; 165/185; 357/81; 174/16 HS
[58] Field of Search ........ 357/81; 174/16 HS, 52 PE; 165/185, 80 B, 80 D; 361/395, 399, 381–383, 386–387, 388

[56] References Cited

U.S. PATENT DOCUMENTS

| | | | |
|---|---|---|---|
| 3,219,885 | 11/1965 | Schniers | 174/16 HS |
| 3,480,837 | 11/1969 | Feldmann | 165/80 B |
| 3,518,493 | 6/1970 | Bathrick | 361/388 |
| 3,859,570 | 1/1975 | Vernath | 357/81 |
| 4,204,248 | 5/1980 | Proffit | 361/388 |
| 4,230,901 | 10/1980 | Wengler | 174/52 PE |

OTHER PUBLICATIONS

Exhibit 1, pp. 1, 19, 20, Catalog E8AV25, Aavid Engineering, Laconia, NH, Heat Sinks, 12/81.
Exhibit 2, pp. 1–10, 11, 12, Catalog 181, "Heat Dissipator . . . ", IREC, Burbank, CA, 1981.
Exhibit 3, pp. 1, 19, 33, 34, S-C Accessories, Thermalloy, Dallas, TX.
Heat-Sink Module, Klein, Elec. Design News, vol. 9, No. 12, Oct. 64, p. 59.

*Primary Examiner*—G. P. Tolin
*Attorney, Agent, or Firm*—Barry E. Sammons

[57] ABSTRACT

An improved semiconductor heat sink for securing a semiconductor thereto for dissipating the heat generated by the semiconductor as well as for supporting those circuit board components which extend upwardly from the circuit board adjacent to the heat sink comprises a vertically extending leg fastened at its lower end to a printed circuit board. The leg has at least one mounting surface thereon for receiving a semiconductor in face to face relationship therewith. Extending outwardly from the leg in opposite directions are a pair of fins, each fin being perpendicular to the mounting surface on the leg. Running along the end of each fin is a downwardly extending projection for engaging a complementary groove in a separate one of a pair of circuit board components, such as connector blocks which each extend upwardly from the circuit board adjacent to a separate one of the fins so that the edges serve to impart further rigidity to the connector blocks.

9 Claims, 3 Drawing Figures

COMBINATION HEAT SINK FOR A SEMICONDUCTOR

BACKGROUND OF THE INVENTION

This invention relates generally to heat dissipative structures for semiconductors, commonly referred to as heat sinks and more particularly to an improved heat sink for not only dissipating the heat generated by a semiconductor but also for imparting additional rigidity to those circuit board components which extend upwardly from the board adjacent to the heat sink to aid in manufacturing.

When designing solid state circuits whose solid state components are to carry large or even moderate currents, care must be taken in the mounting of the solid state circuit components (be they transistors, diodes, silicon controlled rectifiers or any combination thereof) so that heat generated thereby is carried away from the component. If the heat generated by a solid state circuit component is not effectively dissipated, then, component overheating will likely occur which may cause the component to malfunction and ultimately fail. To provide for effective dissipation of the heat produced by solid state circuit components and especially those components carrying large currents, such solid state devices are often mounted to a structure fabricated of heat conductive material, typically aluminum, which serves to carry the heat away from the device. Such heat conductive structures are commonly known in the art as heat sinks and are readily available in differing sizes and shapes to accomodate different types of semiconductors.

In the past, heat sinks have been designed as unitary structures, having no relationship to any of the circuit components other than the solid state devices which are secured thereto so that the heat generated by the solid state component may be dissipated by the heat sink. Despite the often massive size of the heat sink in comparison with other circuit components and the sizable circuit board area occupied by the heat sink, such prior heat sinks generally have not served any other purpose but to dissipate semiconductor heat.

In contrast to the heat sinks of the prior art, the present invention relates to a novel heat sink which not only serves to dissipate the heat of the semiconductor devices fastened thereto but further serves to support and impart rigidity to other components fastened to the circuit board adjacent to the heat sink.

It is an object of the present invention to provide an improved heat sink for not only dissipating the heat generated by solid state circuit components fastened thereto but for supporting other components, such as connector blocks, that are fastened to the circuit board adjacent to the heat sink. Other objects and advantages of the present invention become better understood by reference to the description thereof provided hereinafter.

BRIEF SUMMARY OF THE INVENTION

Briefly, in accordance with preferred embodiment of the invention, an improved heat conductive structure for dissipating the heat generated by a semiconductor connected to a printed circuit board as well as for engaging other printed circuit board components to impart rigidity thereto comprises at least one upwardly extending leg which is secured at its lowermost end to the printed circuit board. Extending outwardly from each leg is at least one cooling fin, each fin extending in a direction generally opposite to the direction of extension of the other of the fins. The fins as well as the legs are each formed of a heat conductive material such as aluminum, and at least one of the legs or fins has a flatted mounting surface thereon for receiving the semiconductor whose heat is to be dissipated. At the outermost end of each fin is a downwardly extending ridge which is dimensioned to engage a complementary channel or groove in a printed circuit board component, such as a connector block, which extends upwardly from the printed circuit board adjacent to the edge to impart greater rigidity to that component.

BRIEF DESCRIPTION OF THE DRAWINGS

The features of the present invention believed to be novel are set forth with particularity in the appended claims. The invention itself, however, both as to organization and the method of operation, together with further objects and advantages thereof, may best be understood by a reference to the following description taken in conjunction with the accompanying drawings in which:

DETAILED DESCRIPTION OF THE PREFERRED EMBODIMENT

Figure 1:
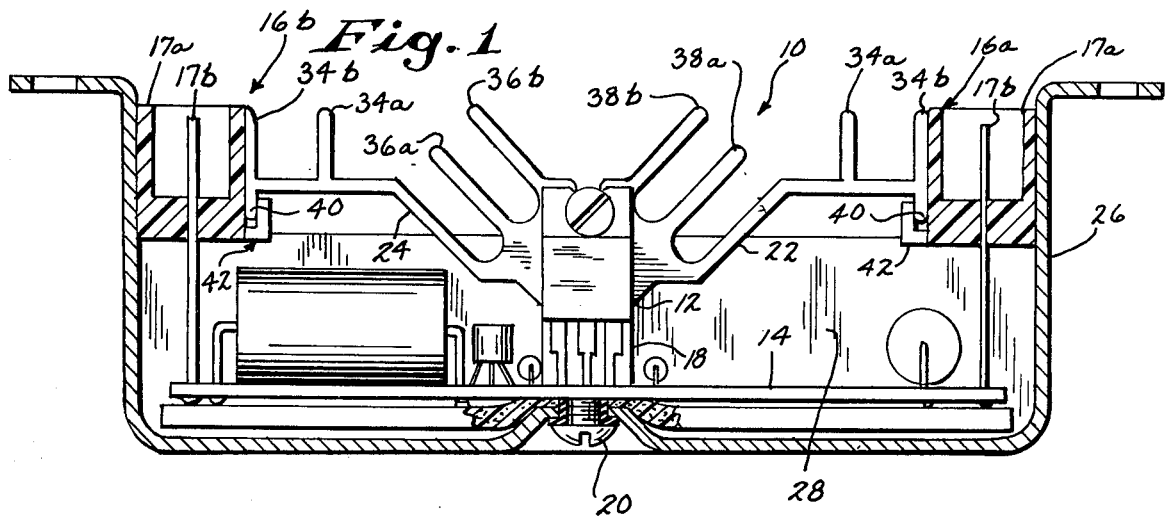
FIG. 1 is a frontal view of the improved semiconductor heat sink of the present invention as employed in conjunction with a printed circuit board assembly.

Referring now to the figures, FIG. 1 illustrates an improved heat-dissipating structure 10, more commonly known as a heat sink, for dissipating the heat generated by a semiconductor, and in particular the heat generated by a power semiconductor 12 of a solid state electrical circuit packaged on a printed circuit board 14. As will become better understood hereinafter by reference to the particular details concerning the structure of heat sink 10, the heat sink not only serves to dissipate the heat generated by a semiconductor, such as semiconductor 12, attached thereto but further serves to engage and support those components on the circuit board which extend upwardly from the circuit board adjacent to the heat sink to impart rigidity thereto. In the presently preferred embodiment, these components comprise a pair of spaced apart connectors 16a and 16b which each include a "U" shaped insulator 17a for receiving the upper end of upwardly extending pin 17b whose lower end is soldered to circuit board 14. The added rigidity imparted to each connector by the heat sink prevents each of pins 17b from moving during assembly which allows automated wave soldering of all circuit board connections, including those connections to each of pins 17b.

Heat sink 10 typically comprises a generally vertically extending leg 18 whose lower end is secured to the circuit board, typically by a screw 20 or the like. Integrally formed to the leg 18 is a pair of fins 22 and 24 which extend upwardly then outwardly from leg 18 in opposite directions. In practice, the fins and leg of heat sink 10 are formed extruding a single, unitary piece of heat-conductive material, preferably aluminum.

In the presently preferred embodiment, each of fins 22 and 24 extend upwardly from leg 18 at approximately a 45 degree angle to a point well above the height of each of the components on circuit board 14 before extending substantially parallel to the circuit board. This particular shape of edges 22 and 24 enables circuit board 14 to be disposed within a protected cavity 26. The cavity is filled with a potting compound 28 to a height above the components on the circuit board 14. Although the potting compound 28 securely encapsulates the leg portion 18 of the heat sink, the surface area of the fins 22 and 24 remains substantially exposed so as not to adversely affect heat transfer from the semiconductor 12.

Figure 2:
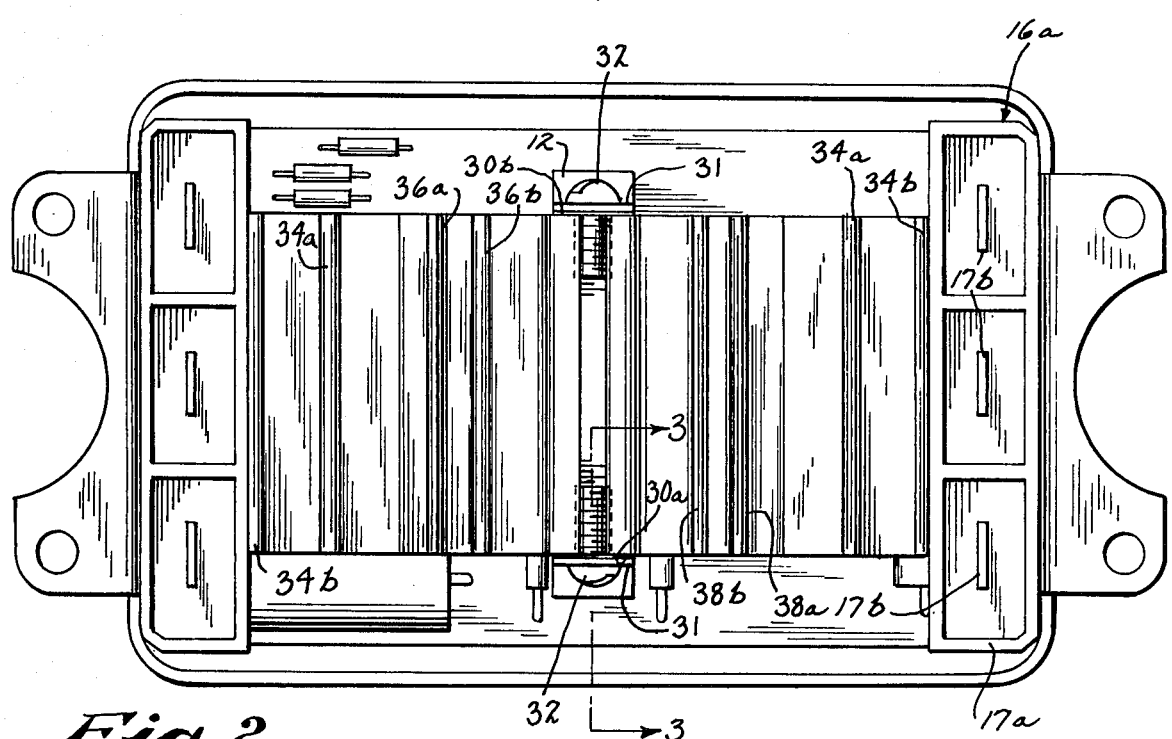
FIG. 2 is a top view of the structure illustrated in FIG. 1.

To enable one or more semiconductors, such as semiconductor 12, to be secured to heat sink 10 so that the heat generated by the semiconductor is dissipated by heat sink 10, at least one and preferably two mounting surfaces 30a and 30b are provided on the heat sink. Typically each mounting surface is located on one of the opposite lateral edges of leg 18 perpendicular to a separate one of fins 22 and 24, respectively, as is best illustrated in FIG. 2. Although each of mounting surfaces 30a and 30b could be located elsewhere on the heat sink such as on edges 22 and 24, locating each mounting surface on a separate one of the lateral edges of the leg 18 advantageously permits each semiconductor secured to that mounting surface to be close enough to the circuit board so that its leads easily extend to the circuit board 14 to enable automatic wave soldering without the need for special attention to be paid to the semiconductors during circuit board assembly.

Figure 3:
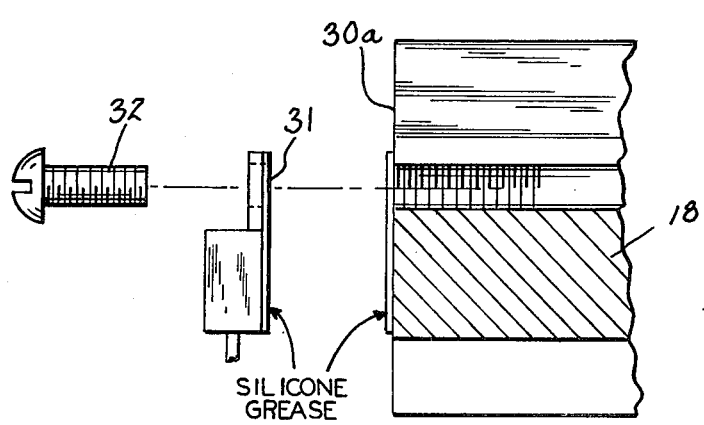
FIG. 3 is an exploded view taken along lines 3—3 of FIG. 2 illustrating the mounting of a semiconductor to the heat sink of the present invention.

The details of how a semiconductor, such as semiconductor 12, is secured to a mounting surface, such as mounting surface 30a, are illustrated in FIG. 3. As shown, the mounting tab 31 of the power semiconductor 12 is secured in face-to-face relationship with the mounting surface 30a by a screw 32 which extends through the semiconductor mounting tab into the heat sink mounting surface 30a. Before securing semiconductor 12 to the heat sink 10, thermal joint compound, usually a silicone grease, is applied to both the mounting surface 30a and the semiconductor 12 mounting tab 31 to assure good heat transfer therebetween. When electrical insulation between the semiconductor mounting tab and heat sink 12 is desired, a mica insulator (not shown) is disposed therebetween.

Returning now to FIGS. 1 and 2, each of edges 22 and 24 has a pair of ribs 34a and 34b extending upwardly from that portion of the edge parallel to the circuit board, with rib 34b extending upwardly from the end of each edge and rib 34a being located on the edge inwardly from rib 34b. In addition to ribs 34a and 34b on each of edges 22 and 24, two pairs of ribs 36a and 36b and 38a and 38b extend upwardly from leg 34 so that the ribs of each pair are parallel to and spaced apart from the upwardly sloping portion of a separate one of edges 22 and 24, respectively. Each of ribs 34a and 34b on edges 22 and 24 and ribs 36a and 36b and 38a and 38b which extend upwardly from leg 18 provide additional surface area to dissipate the heat generated by the semiconductors.

As indicated previously, heat sink 10 not only dissipates the heat of a semiconductor secured thereto but advantageously imparts rigidity to those circuit board components, such as connectors 16a and 16b which extend upwardly from circuit board 14 adjacent to the heat sink. To this end, each of edges 22 and 24 has a downwardly extending ridge 40 which extends along the end of each edge for engaging the adjacent upwardly extending circuit board component. In the presently preferred embodiment, ridge 40 on each fin is dimensioned to be received in a channel 42 running along the side of each insulator 17a which forms part of each connector 16a and 16b. The engagement of ridge 40 with the channel 42 on each insulator 17a locks both outwardly extending fins on the heat sink 10 with the upwardly extending connectors 16a and 16b. The rigidity thus imparted to each of connectors 16a and 16b by the heat sink 10 is particularly useful during assembly of the structure when connector pins 17b on each connector 16a and 16b have not yet been soldered. It is desirable to solder all of the components on the circuit board 14 during a single pass through a soldering machine and the interlocked parts insure that connectors 16a and 16b are aligned properly during this soldering process.

The foregoing provides an improved heat sink for a semiconductor which not only dissipates the heat of the semiconductor fastened thereto but which also serves to impart rigidity to circuit board components which extend upwardly from the circuit board adjacent to the heat sink.

While only certain preferred features of the invention have been shown by way of illustration, many modifications and changes will occur to those skilled in the art. It is, therefore, to be understood that the appended claims are intended to cover all such modifications and changes as found within the true spirit of the invention.

What is claimed is:

1. An improved heat-conductive structure and a printed circuit board having components connected thereto, said heat-conductive structure having a mounting surface to which a semiconductor is mounted to dissipate the heat generated by the semiconductor and in addition, said heat-conductive structure supporting components on the circuit board which extend upwardly from the circuit board, said heat conductive structure comprising:
   a leg attached at one of its ends to the printed circuit board and providing said mounting surface;
   a fin integrally formed to and extending outwardly from the leg a substantial distance above the printed circuit board; and
   component-engaging means carried at the outer end of the fin, said component-engaging means engaging an upwardly extending circuit board component to impart rigidity to the upwardly extending circuit board component during the assembly process.

2. The invention according to claim 1 wherein said fin has an upwardly sloping portion integrated to said leg and a planar section extending out from the free end of said sloping fin section substantially parallel to the circuit board.

3. The invention according to claim 1 wherein said fin has a plurality of upwardly extending ribs.

4. The invention according to claim 3 wherein one of said ribs on said fin extend upwardly along the end of said fin so as to be an abutment with the upwardly extending circuit board component located adjacent to said edge.

5. The invention according to claim 1 wherein said leg has a plurality of ribs extending outwardly therefrom.

6. The invention according to claim 1 wherein said component engaging means comprises a ridge which extends downwardly along the end of each of said edges for engaging the adjacent upwardly extending circuit board component.

7. An improved heat conductive structure and a printed circuit board having a plurality of components thereon, the components including at least one semiconductor and a pair of parallel, spaced apart connecting blocks each extending upwardly from the circuit board on either side of said heat-conductive structure, said heat-conductive structure comprising:

a leg attached at its lower end to the printed circuit board;

a pair of fins each integrally formed to and extending upwardly and outwardly in opposite directions from said leg, the end of each fin being positioned a substantial distance above the printed circuit board;

at least one mounting surface disposed on a lateral edge of said leg in a plane which is substantially perpendicular to the plane of each of said fins, said mounting surface receiving a semiconductor in face-to-face relationship therewith; and a ridge extending downwardly from the end of each fin in engagement with a separate one of the upwardly extending connector blocks to impart rigidity to the connector block.

8. The invention according to claim 7 wherein each of said fins includes a pair of upwardly extending ribs, one of said ribs extending upwardly from the end of said fin in alignment with said ridge so as to be in abutment with the connector block.

9. The invention according to claim 7 further including a plurality of ribs each extending upwardly from said leg so as to be parallel to the upwardly extending portion of a separate one of said edges.

* * * * *